United States Patent [19]
Choi

[11] Patent Number: 5,812,454
[45] Date of Patent: Sep. 22, 1998

[54] NAND-TYPE FLASH MEMORY DEVICE AND DRIVING METHOD THEREOF

[75] Inventor: Jung-dal Choi, Kyungki-do, Rep. of Korea

[73] Assignee: Samsung Electronics Co., Ltd., Suwon, Rep. of Korea

[21] Appl. No.: 771,174

[22] Filed: Dec. 20, 1996

[30] Foreign Application Priority Data

Dec. 20, 1995 [KR] Rep. of Korea .................... 95 52706

[51] Int. Cl.$^6$ .................... G11C 11/34; G11C 7/00
[52] U.S. Cl. .................... 365/185.17; 365/185.29; 365/185.33; 365/218
[58] Field of Search .................... 365/185.01, 185.17, 365/185.29, 185.33, 218

[56] References Cited

U.S. PATENT DOCUMENTS

| | | | |
|---|---|---|---|
| 4,962,481 | 10/1990 | Choi | 365/185.17 |
| 5,204,839 | 4/1993 | Lee et al. | 365/185.17 |
| 5,590,072 | 12/1996 | Choi | 365/185.01 |

*Primary Examiner*—David C. Nelms
*Assistant Examiner*—Trong Phan
*Attorney, Agent, or Firm*—Myers Bigel Sibley & Sajovec

[57] ABSTRACT

A NAND-type flash memory device and driving method thereof is provided. The NAND-type flash memory device includes a first and a second string, a first and a second string select line, a plurality of wordlines, and a first and a second source select line between a bit line contact and a source line. Therefore, predetermined voltages are applied to a first source select line connecting a gate electrode of the first source select transistor, and a second source select line connecting a gate electrode of the second source select transistor to a gate electrode of the fourth source select transistor, thereby preventing unselected cell transistors adjacent to a selected cell transistor from being programmed during program operation of the selected cell transistor.

20 Claims, 2 Drawing Sheets

NAND-TYPE FLASH MEMORY DEVICE AND DRIVING METHOD THEREOF

FIELD OF THE INVENTION

The present invention relates to a non-volatile memory device and driving method thereof, and more particularly, to a NAND-type flash memory device and driving method thereof.

BACKGROUND OF THE INVENTION

Among the several types of read-only memory (ROM) devices, a flash memory device, a type of non-volatile EEPROM (Electrically Erasable & Programmable Read Only Memory) device, is widely used for computers or memory cards.

Such a flash memory device is becoming more highly integrated together with general semiconductor devices. In general, a cell transistor corresponding to a cell of the flash memory device has a floating gate which stores charges and a control gate which induces a predetermined voltage to the floating gate, and is connected to a bit line for transferring information. Flash memory devices are generally divided into a NOR type and a NAND type, according to the bit line connection format.

The NOR-type flash memory device has a structure in which a multitude of memory cells are connected to a bit line in parallel. A channel hot electron phenomenon is utilized in programming information in a memory cell, and a Fowler-Nordheim tunneling phenomenon is utilized in erasing information. In such a NOR-type flash memory device, since the bit line thereof is connected to the respective memory cells in parallel, a large cell current can be obtained, but may have a drawback in that the area occupied by a cell array region is large. Therefore, the NOR-type flash memory device may not be suitable as a highly integrated flash memory device, despite its fast operational speed.

The NAND-type flash memory device has a structure in which a plurality of cell strings are connected to a bit line via a bit line contact hole, and each cell string is connected to a plurality of cell transistors in series. The NAND-type flash memory device stores or erase information using the Fowler-Nordheim tunneling phenomenon in which charges pass through a tunnel oxide film interposed between a substrate and a floating gate, according to the polarity of a voltage applied to the control gate of a cell transistor and the drain thereof.

In the NAND-type flash memory device, since a plurality of cell transistors are connected to a bit line in series, the cell current can be smaller than that of the NOR-type flash memory device. Therefore, whereas the NAND-type flash memory device may be slower than the NOR-type flash memory device in terms of the operational speed, it is possible to improve the degree of integration.

In conclusion, the NAND-type flash memory device which can be integrated to a higher degree is generally more suitable as a highly integrated flash memory device than is the NOR-type flash memory device. As one method for improving the operational speed of the NAND-type flash memory device, the delay time of an electrical signal due to a bit line is reduced by decreasing the resistance of the bit line. However, since the pitch of the bit line of the general NAND-type flash memory device is the same as that of the string, the pitch of the string may limit the line width of the bit line. Therefore, the degree of improvement in the resistance of the bit line may be limited. A NAND-type flash memory device for solving such a problem is disclosed in the U.S. Pat. No. 4,962,481.

FIGS. 1 and 2 are a layout arrangement view and an equivalent circuit diagram, respectively, of an array of the NAND-type flash memory device disclosed in U.S. Pat. No. 4,962,481.

Referring to FIGS. 1 and 2, the cell array region of the conventional NAND-type flash memory device includes a first active region S1 in which a first string is formed, a second active region S2 in which a second string is formed disposed parallel to the first active region S1, a source line SL connecting ends of each of the first and second active regions S1 and S2 and disposed perpendicular to the first and second active regions S1 and S2, a third active region S3 connecting ends of each of the first and second active regions S1 and S2, opposite to the source line SL, a first string select line SSL1, a second string select line SSL2 and a plurality of wordlines W/L1 through W/Ln, the first and second string select lines and wordlines extending across the first and second active regions S1 and S2, a bit line contact 12 disposed on the third active region for exposing a predetermined portion of the third active region, a bit line B/L covering the contact 12 and disposed parallel to the first and second active regions S1 and S2.

Here, the first and second string select lines SSL1 and SSL2 are disposed to extend across the first and second active regions S1 and S2 adjacent to the bit line contact 12, and the plurality of wordlines W/L1 through W/L2 are disposed to extend across the first and second active regions S1 and S2 between the second string select line SSL2 and source line SL. A string select transistor 10 formed at portions around the intersections of the first string select line SSL1 and second active region S2 and at that of the second string select line SSL2 and first active region S1 is a depletion type transistor having a negative (−) threshold voltage. A string select transistor (not shown) formed at the intersectional portion of the first string select line SSL1 and first active region S1 and at that of the second string select line SSL2 and second active region S2 is an enhancement type transistor having a positive (+) threshold voltage.

Also, floating gates in which charges are accumulated are disposed at the intersectional portion of the plurality of wordlines W/L1 through W/Ln and first active region S1 and at the intersectional portions of the plurality of wordlines W/L1 through W/Ln and second active region S2, and program or erase the respective cells.

In the conventional NAND-type flash memory device having the aforementioned configuration, the first string is constituted by two string select transistors and a plurality of cell transistors, formed on the first active region S1 and each having different threshold voltages, and the second string is constituted by two string select transistors and a plurality of cell transistors, formed on the second active region S2 and each having different threshold voltages.

The method of driving a cell of the above-described conventional NAND-type flash memory device as disclosed in the U.S. Pat. No. 4,962,481 will now be described.

Referring to FIG. 2, the operation of programming a predetermined cell, i.e., a cell A formed at the intersection of the second wordline W/L2 and first active region S1, is performed such that a ground potential (0 volts) is applied to a selected bit line B/L, a power supply voltage $V_{cc}$ of 5 volts is applied to the first string select line SSL1 and second string select line SSL2, respectively, a program voltage of 18 volts is applied to a selected wordline, i.e., the second wordline W/L2, and a voltage of 5 volts is applied to the unselected wordlines W/L1 and W/L3 through W/Ln, and the source line is floated.

In such a manner, the cell A of the first string is programmed so that a cell B formed at the intersectional portion of the selected second wordline W/L2 and second active region S2 is also programmed. The reason for the foregoing will be explained. Since a power supply voltage is applied to both the first string select line SSL1 and the second string select line SSL2, all string select transistors are turned on, which transfers the ground potential applied to the selected bit line B/L to the drain of the cell B of the second string. If 5 volts and 0 volts is applied to the first string select line SSL1 and the second string select line SSL2, respectively, the string select transistors of the first string are all turned on, but the enhancement type string select transistors of the second string are turned off. Accordingly, 0 volts applied to the selected bit line B/L can be prevented from being transferred to the drain of the cell B. However, since a power supply voltage is applied to all unselected wordlines W/L1 through W/Ln to turn all unselected cells on, the ground potential applied to the bit line B/L is transferred to the source of the cell B of the second string through the source line SL. Therefore, cell B is also programmed.

Now, the operation of erasing information stored in a cell of the conventional NAND-type flash memory device, i.e., the cell A of the first string, will be described. That is, a voltage of 13 volts is applied to the selected bit line, an erase inhibition voltage $V_{ei}$ of 4 volts is applied to an unselected bit line (not shown), a pass voltage $V_{pass}$ higher than 13 volts is applied to the first and second string select lines SSL1 and SSL2, 0 volts is applied to the selected wordline, i.e., the second wordline W/L2, the pass voltage $V_{pass}$ is applied to the first wordline W/L1 between the second string select line SSL2 and selected second wordline W/L2, a power supply voltage $V_{cc}$ of 5 volts is applied to unselected wordlines W/L3 through W/Ln between the selected second wordline W/L2 and source line SL, and the source line SL is floated.

As described above, in order to erase the selected cell A in the conventional NAND-type flash memory device, a high voltage of 13 volts is applied to the selected bit line B/L. Thus, it is difficult to improve device isolation characteristics between adjacent bit contacts.

As described above, in the conventional NAND-type flash memory device, it is difficult to selectively program only one cell within one string and to improve the device isolation characteristics between bit contacts during an erase operation.

SUMMARY OF THE INVENTION

The present invention provides a NAND-type flash memory device which can selectively program a cell within a string by providing a source select line between a plurality of wordlines and a source line. Improved device isolation characteristics between bit line contacts may also be provided.

In particular, a NAND-type flash memory device comprises a cell array region in which a pair of strings sharing a bit line and a source line, first and second string select lines, a plurality of wordlines, and first and second source select lines are repeatedly arranged in a matrix, the NAND-type flash memory device comprising: a first string of the pair of strings containing a first string select transistor of an enhancement type sequentially connected in series between the bit line and the source line, a second string select transistor of a depletion type, a plurality of first cell transistors each having a floating gate and a control gate, a first source select transistor of an enhancement type, and a second source select transistor of a depletion type; a second string of the pair of strings containing of a third string select transistor of a depletion type sequentially connected in series between the bit line and the source line, a fourth string select transistor of an enhancement type, a plurality of second cell transistors each having a floating gate and a control gate, a third source select transistor of a depletion type, and a fourth source select transistor of an enhancement type; a first string select line connected to a gate electrode of said first string select transistor and a gate electrode of said third string select transistor; a second string select line connected to a gate electrode of said second string select transistor and a gate electrode of said fourth string select transistor; a plurality of wordlines connecting each control gate of said first cell transistors and each control gate of said second cell transistors; a first source select line connected to a gate electrode of said first source select transistor and a gate electrode of said third source select transistor; and a second source select line connected to a gate electrode of said second source select transistor and a gate electrode of said fourth source select transistor.

A method of driving a NAND-type flash memory device having a cell array region is provided, the cell array region including: a first string containing a first string select transistor of an enhancement type sequentially connected in series between a bit line and a source line, a second string select transistor of a depletion type, a plurality of first cell transistors each having a floating gate and a control gate, a first source select transistor of an enhancement type, and a second source select transistor of a depletion type; a second string containing a third string select transistor of a depletion type sequentially connected in series between said bit line and said source line, a fourth string select transistor of an enhancement type, a plurality of second cell transistors each having a floating gate and a control gate, a third source select transistor of a depletion type, and a fourth source select transistor of an enhancement type; a first string select line connected to a gate electrode of said first string select transistor and a gate electrode of said third string select transistor; a second string select line connected to a gate electrode of said second string select transistor and a gate electrode of said fourth string select transistor; a plurality of wordlines connecting each control gate of said first cell transistors and each control gate of said second cell transistors; a first source select line connected to a gate electrode of said first source select transistor and a gate electrode of said third source select transistor; and a second source select line connected to a gate electrode of said second source select transistor and a gate electrode of said fourth source select transistor, wherein said first string, said second string, said first string select line, said second string select line, said plurality of wordlines, said first source select line, and said second source select line are repeatedly arranged in a matrix type, the NAND-type flash memory device driving method comprising: applying 0 volt and a program inhibition voltage to said selected bit line and said selected source line, respectively; applying a first voltage to said first string select line and said second source select line passing between said selected bit line and said selected source line and applying a second voltage different from said first voltage to said second string select line and said first source select line passing between said selected bit line and said selected source line, to thereby select a string; and applying a program voltage and a pass voltage to the selected wordline and unselected wordlines among the plurality of wordlines passing through said selected string, respectively, thereby selectively programming a cell transistor in the intersectional portion of said selected string and said selected wordline, wherein said first string, said second string, said first string select line, said second string select line, said plurality of wordlines, said first source select line, and said second source select line are repeatedly arranged on a body in a matrix type, the NAND-type flash memory device driving method comprising: applying 0 volt to said selected bit line; floating source line, unselected wordlines, said first and second string select lines, said first and second source select lines, said bit line and said source line; and applying an erase voltage to said body, thereby selectively erasing a cell transistor connected to said selected wordline, wherein said first string, said second string, said first string select line, said second string select line, said plurality of wordlines, said first source select line, and said second source select line are repeatedly arranged on a body in a matrix type, the NAND-type flash memory device driving method comprising: applying a bit line voltage for reading and 0 volt to said selected bit line and source line, respectively; applying a third voltage to said first string select line and first source select line between said selected bit line and source line, and applying a fourth voltage different from said third voltage to said second string select line and second source select line between said selected bit line and said selected source line, to select a string; and applying a read voltage and 0 volt to said selected wordline and unselected wordlines, respectively, thereby selectively reading out information stored in a cell transistor in the intersectional portion of said selected string and said selected wordline.

The program inhibition voltage is between a power supply voltage and a voltage double said power supply voltage.

The second string is selected when said first voltage is 0 volt and said second voltage is a voltage between a power supply voltage and a voltage double said power supply voltage, respectively.

The first string is selected when said first voltage is between a power supply voltage and a voltage double said power supply voltage, and said second voltage is 0 volt.

The program voltage is 12~20 volt.

The pass voltage is lower than said program voltage and higher than a threshold voltage of the programmed cell.

The program inhibition voltage is 15~20 volts.

The second string is selected when said third and fourth voltages are 0 volt and a read voltage, respectively.

The first string is selected when said third and fourth voltages are a read voltage and 0 volt, respectively.

The read voltage is between a power supply voltage and a voltage double said power supply voltage.

The read voltage is between a power supply voltage and a voltage double said power supply voltage.

According to the present invention, in each string, the first source select transistor and second source select transistor having different threshold voltages are provided between the plurality of cell transistors and the source line, so that a cell transistor adjacent to the selected cell transistor and having a common wordline can be prevented from also being programmed when a selected cell transistor is programmed. Also, since a voltage higher than the power supply voltage is not applied between adjacent bit lines during program, erase or read operation, the device isolation characteristics between the adjacent bit lines can be maintained.

DETAILED DESCRIPTION OF THE INVENTION

Figure 1:
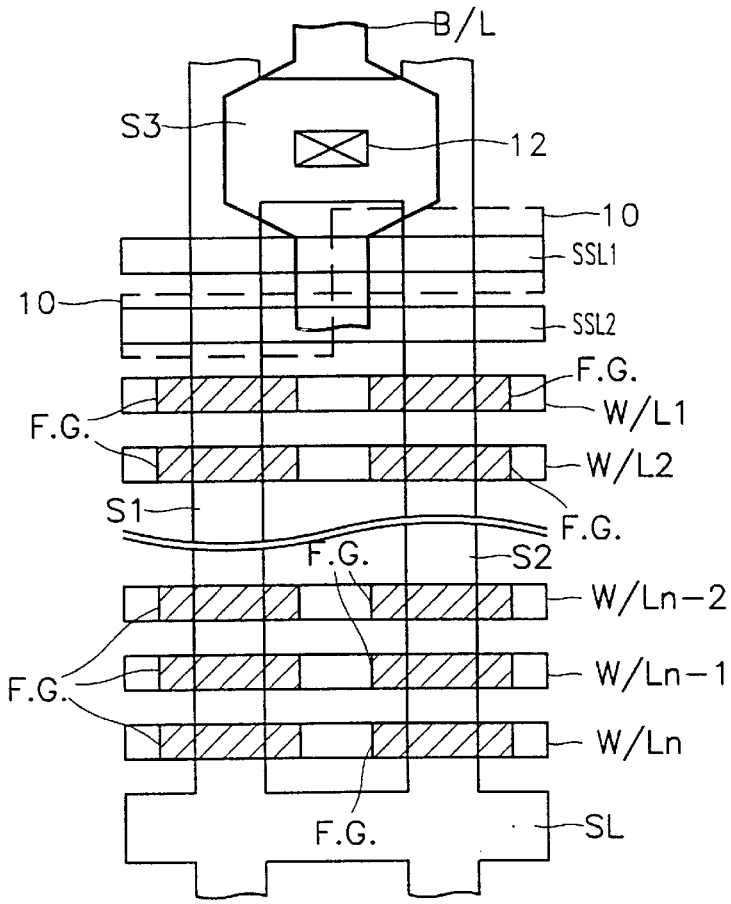
FIG. 1 is a layout arrangement view of a cell of a conventional NAND-type flash memory device.
Figure 2:
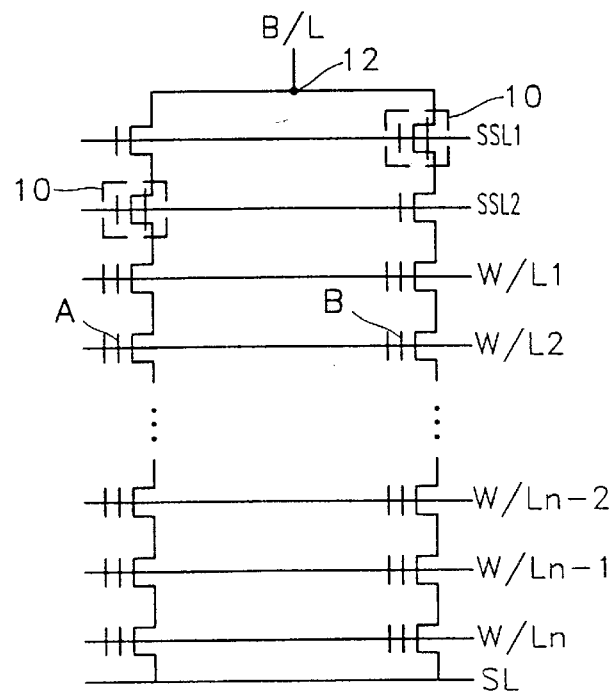
FIG. 2 is an equivalent circuit diagram of FIG. 1.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Hereinbelow, the NAND-type flash memory device and a driving method thereof according to a preferred embodiment of the present invention will be described in detail with reference to the accompanying drawings.

Figure 3:
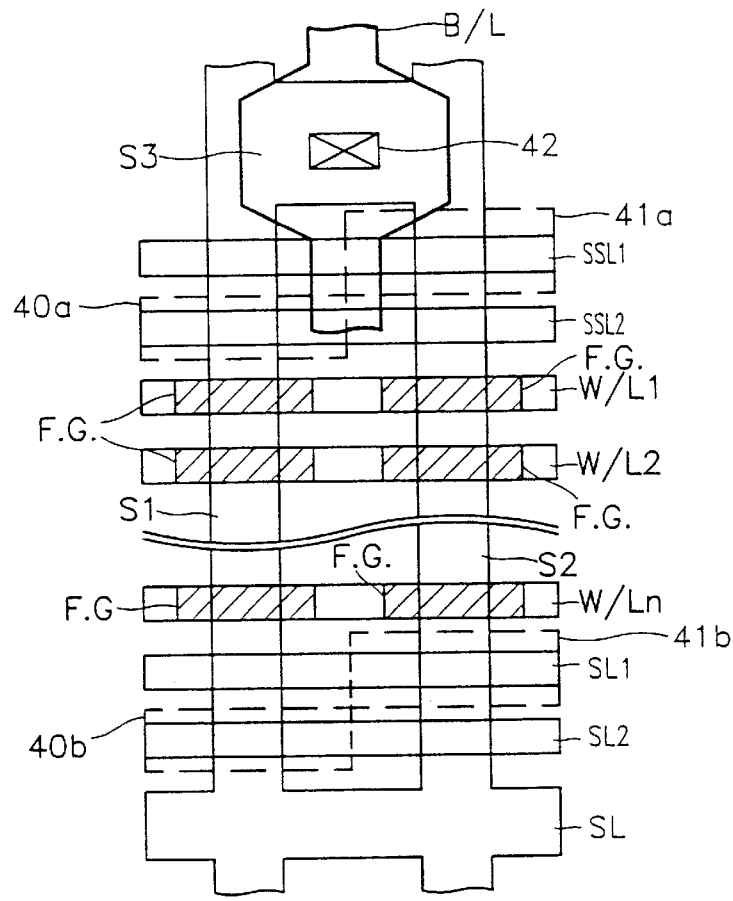
FIG. 3 is a layout arrangement view of a cell of a NAND-type flash memory device according to a preferred embodiment of the present invention.
Figure 4:
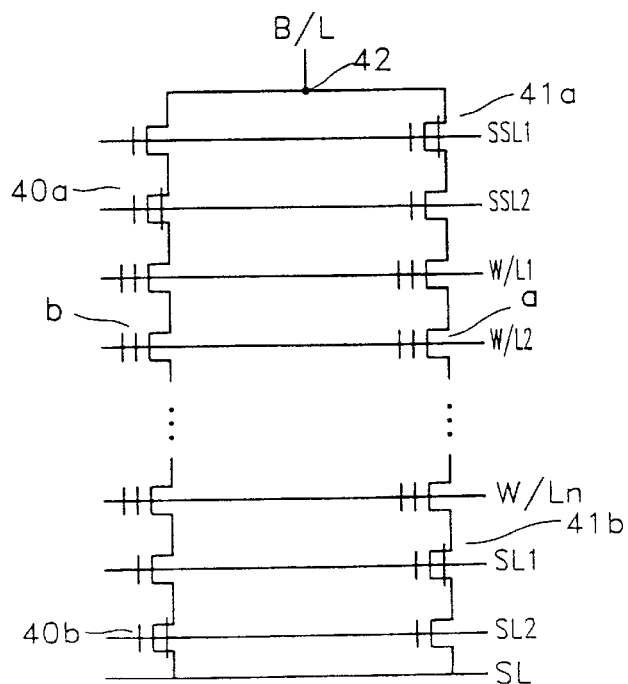
FIG. 4 is an equivalent circuit diagram of FIG. 3.

Referring to FIGS. 3 and 4, the NAND-type flash memory device according to a preferred embodiment of the present invention includes first and second active regions S1 and S2 disposed parallel to each other, a source line SL connecting one end of each of the first and second active regions S1 and S2 and disposed perpendicular to the first and second active regions S1 and S2, a third active region S3 connecting the other end of each of the first and second active regions S1 and S2 and disposed perpendicular to the first and second active regions S1 and S2, a bit contact 42 disposed in the third active region to expose a predetermined portion of the third active region, a bit line B/L connected to the third active region through the bit contact 42 and disposed parallel to the first and second active regions S1 and S2, a first string select line SSL1 extending across the first and second active regions S1 and S2 close to the bit contact 42, a second string select line SSL2 sequentially disposed to extend across the first and second active regions S1 and S2 being between the first string select line SSL1 and the source line SL, a plurality of wordlines W/L1 through W/Ln, a first source select line SL1, and a second source select line SL2. Here, cell transistors are formed at all intersectional portions of the plurality of wordlines W/L1 through W/Ln, and the first and second active regions S1 and S2, respectively. Each cell transistor has a floating gate FG for storing charges and a control gate for inducing a predetermined voltage to the floating gate FG. The control gate is connected to the wordline so that the cell transistor is operated by the voltage applied to the wordline.

A first string select transistor is formed at the intersectional portion of the first string select line SSL1 and first active region S1, and a second string select transistor 40a is formed at the intersectional portion of the second string select line SSL2 and second active region S2. Also, a third string select transistor 40a is formed at the intersectional portion of the first string select line SSL1 and second active region S2, and a fourth string select transistor is formed at the intersectional portion of the second string select line SSL2 and second active region S2. Here, both the second and third string select transistors 40a and 41a are comprised of each depletion type transistor having a negative (−) threshold voltage $V_{th}$. Both the first and fourth string select transistors are comprised of enhancement type transistor having a positive (+) threshold voltage $V_{th}$, e.g., 0 volts to 1 volt.

A first source select transistor of an enhancement type is formed at the intersectional portion of the first source select line SL1 and first active region S1, and a second source select transistor 40b of a depletion type is formed at the intersectional portion of the second source select line SL2 and first active region S1. Also, a third source select transistor 41b of a depletion type is formed at the intersectional portion of the first source select line SL1 and second active region S2, and a fourth source select transistor of an enhancement type is formed at the intersectional portion of the second source select line SL2 and second active region S2.

The plurality of cell transistors, first source select transistor and second source select transistor 40b formed on the first string select transistor, second string select transistor 40a and first active region S1, respectively, form a first string. The plurality of cell transistors, third source select transistor 41b and fourth source select transistor formed on the third string select transistor 41a, fourth string select transistor 40a and second active region S2, respectively, form a second string. A pair of strings including the first and second strings are repeatedly arranged in a matrix type to form a cell array region.

The first and fourth string select transistors and the first and fourth source select transistors are preferably formed to all have the same positive (+) threshold voltage. The second and third string select transistors and the second and third source select transistors are preferably formed to all have the same negative (−) threshold voltage.

Next, the method of driving the NAND-type flash memory device according to the present invention, i.e., program, erase and read operations, will be described.

First, in the NAND-type flash memory device according to the present invention, the operation of programming a predetermined cell transistor, i.e., a cell transistor a formed at the intersectional portion of the second wordline W/L2 and second active region S2, is performed such that 0 volt is selectively applied to the bit line B/L connected to the second string containing the cell transistor a, a power supply voltage $V_{cc}$ to a voltage double the power supply voltage, i.e., $V_{cc} \sim 2V_{cc}$, is applied to an unselected bit line (not shown), a program inhibition voltage $V_{pi}$, i.e., $V_{cc}$ 18 $2V_{cc}$, is applied to the source line SL, 0 volts is applied to the body, a program voltage $V_{pgm}$ of 12~20 volts and a pass voltage $V_{pass}$ higher than the threshold voltage of the programmed cell transistor and lower than the program voltage $V_{pgm}$ and are applied to the selected second wordline W/L2 and unselected wordlines W/L1 and W/L3 through W/Ln, respectively, a first voltage is applied to the first string select line SSL1 and second source select line SL2 passing through the string containing the selected cell transistor a, and a second voltage different from the first voltage is applied to the second string select line SSL2 and first source select line SL1.

Here, the first and second voltages for selecting the second string are preferably 0 volts and a power supply voltage to a voltage double the power supply voltage, i.e., $V_{cc} \sim 2V_{cc}$, respectively. In the case of selecting the first string, the first and second voltages are preferably a power supply voltage to a voltage double the power supply voltage, i.e., $V_{cc} \sim 2V_{cc}$, and 0 volts, respectively.

In such a manner, if predetermined voltages are applied to control lines each constituted by the respective bit lines, select lines and wordlines, the third and fourth string select transistors are turned on to transfer 0 volts applied to the selected bit line B/L to the drain of the selected cell transistor a. Also, a higher voltage of 12~20 volts is applied to the second wordline W/L2 connected to the control gate of the selected cell transistor a so that electrons are injected to the floating gate of the selected cell transistor α. Accordingly, the cell transistor a will have a threshold voltage of about 2~3 volts. In this case, since the first string select transistor formed in the first string is turned off, and both the first source select transistor and the second source select transistor 40b are turned on, the drain of a cell transistor b where the first active region S1 and the selected second wordline W/L2 intersect each other is floated, and the program inhibition voltage $V_{pi}$ is applied to the source thereof. Accordingly, the cell transistor b is not programmed. As a result, the cell transistor a can be selectively programmed without affecting the cell transistor b.

Next, the operation of erasing the cell transistor of the NAND-type flash memory according to the present invention will be described.

The erase operation of the cell transistor of the NAND-type flash memory according to the present invention is the same as that of the conventional NAND-type flash memory device, which will now be described briefly. That is, 0 volts is applied to a selected wordline, e.g., the second wordline W/L2, an erase voltage $V_e$ of 15~20 volts is applied to the body, and all bit lines, select lines, unselected wordlines and source lines are floated.

If 0 volts and an erase voltage $V_e$ are applied to the selected wordline W/L2 and body, respectively, the cell transistors connected to the selected second wordline W/L2 are all erased. This is because electrons stored in the floating gate of the cell transistor connected to the selected wordline W/L2 are tunneled to the body so that the selected cell transistor has a negative (−) threshold voltage.

Next, the method of reading out the information stored in a predetermined cell transistor of the NAND-type flash memory device according to the present invention will be explained.

In the NAND-type flash memory device according to the present invention, the operation of reading information stored in a predetermined cell transistor, e.g., the cell transistor a formed at the intersectional portion of the second wordline W/L2 and second active region S2, is performed such that a bit line voltage for reading ($V_{rb}$), e.g., 0 volts to a voltage corresponding to the power supply voltage $V_{cc}$, is applied to the selected bit line B/L, an unselected bit line (not shown) is floated, 0 volts is applied to the source line SL and body, 0 volts is applied to the first string select line SSL1 and first source select line SL1, a read voltage $V_{read}$ corresponding to $V_{cc} \sim 2V_{cc}$ is applied to the second string select line SSL2 and second source select line SL2 to select the second string, 0 volts is applied to the second wordline W/L2 passing through the cell transistor a to select the second wordline W/L2, and the read voltage $V_{read}$ is applied to the unselected wordlines W/L1 and W/L3 through W/Ln adjacent to the selected second wordline W/L2.

If predetermined voltages are applied to the control lines, respectively, the first string select transistor and first source select transistor constituting the first string are turned off so that the first string is not selected, and the third string select transistor 41a, fourth string select transistor, third source select transistor and fourth source select transistor constituting the second string are all turned on to then select the second string. In such a state where the second string is selected, the read voltage is applied to the unselected wordlines W/L1 and W/L3 through W/Ln to turn on all the unselected cell transistors of the second string. Then, if 0 volts is applied to the second wordline W/L2 passing through the selected cell transistor a, cell current may flow or not between the selected bit line B/L and source line SL according to the information stored in the selected cell transistor a. That is to say, if the selected cell transistor a is programmed to have a threshold voltage of 2~3 volts, the cell current does not flow therebetween. Otherwise, if the cell transistor a is erased to have a negative (−) threshold voltage, the cell current flows therebetween. Therefore, the cell current is sensed through a sense amplifier (not shown) in the peripheral circuit region connected to the selected bit line B/L, thereby determining the information stored in the selected cell transistor.

The driving method of the aforementioned NAND-type flash memory device according to the present invention will be described in the following table.

TABLE

|  | Program | Erase | Read |
|---|---|---|---|
| Selected B/L | 0 (V) | Floating | $V_{rb}$ |
| Unselected B/L | $V_{cc}$~2 $V_{cc}$ | Floating | floating |
| SSL1 (1st string/2nd string) | $V_{cc}$~2 $V_{cc}$/0 (V) | Floating | $V_{read}$/0 (V) |
| SSL2 (1st string/2nd string) | 0 (V)/$V_{cc}$~2 $V_{cc}$ | Floating | 0 (V)/$V_{read}$ |
| Selected W/L | $V_{pgm}$ | 0 (V) | 0 (V) |
| Unselected W/L | $V_{pass}$ | floating | $V_{read}$ |
| SL1 (1st string/2nd string) | 0 (V)/$V_{cc}$~2 $V_{cc}$ | floating | $V_{read}$/0 (V) |
| SL2 (1st string/2nd string) | $V_{cc}$~2 $V_{cc}$/0 (V) | floating | 0 (V)/$V_{read}$ |
| SL | $V_{pi}$ | floating | 0 (V) |
| Body | 0 (V) | $V_e$ | 0 (V) |

As described above, according to the present invention, a cell transistor adjacent to the selected cell transistor can be prevented from also being programmed during the program operation of the selected transistor. Also, since the voltage applied to the bit line during the program, erase or read operation is not higher than the power supply voltage $V_{cc}$, the device isolation characteristics between adjacent bit contacts are prevented from being deteriorated. Therefore, a cell array region suitable for a highly integrated NAND-type flash memory device can be implemented.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A NAND-type flash memory device having a cell array region in which a pair of strings sharing a bit line and a source line, first and second string select lines, a plurality of wordlines, and first and second source select lines are repeatedly arranged in a matrix, the NAND-type flash memory device comprising:

a first string of the pair of strings containing a first string select transistor of an enhancement type sequentially connected in series between the bit line and the source line, a second string select transistor of a depletion type, a plurality of first cell transistors each having a floating gate and a control gate, a first source select transistor of an enhancement type, and a second source select transistor of a depletion type;

a second string of the pair of strings containing of a third string select transistor of a depletion type sequentially connected in series between the bit line and the source line, a fourth string select transistor of an enhancement type, a plurality of second cell transistors each having a floating gate and a control gate, a third source select transistor of a depletion type, and a fourth source select transistor of an enhancement type;

a first string select line connected to a gate electrode of said first string select transistor and a gate electrode of said third string select transistor;

a second string select line connected to a gate electrode of said second string select transistor and a gate electrode of said fourth string select transistor;

a plurality of wordlines connecting each control gate of said first cell transistors and each control gate of said second cell transistors;

a first source select line connected to a gate electrode of said first source select transistor and a gate electrode of said third source select transistor; and a second source select line connected to a gate electrode of said second source select transistor and a gate electrode of said fourth source select transistor.

2. A NAND-type flash memory device comprising:

first and second memory cell strings, extending in parallel between a bit line and a source line;

the first memory cell string comprising a first string select transistor, a second string select transistor, a plurality of first floating gate memory cell transistors, a first source select transistor and a second source select transistor which are serially connected between the bit line and the source line;

the second memory cell string comprising a third string select transistor, a fourth string select transistor, a plurality of second floating gate memory cell transistors, a third source select transistor and a fourth source select transistor which are serially connected between the bit line and the source line;

a plurality of word lines, a respective one of which is connected to a respective one of the plurality of first and second floating gate memory cell transistors;

a first string select line which is connected to the first and third string select transistors;

a second string select line which is connected to the second and fourth string select transistors;

a first source select line which is connected to the first and third source select transistors; and a second source select line which is connected to the second and fourth source select transistors.

3. A NAND-type flash memory device according to claim 2 wherein the first source select transistor and the fourth source select transistor are enhancement type transistors and wherein the second and third source select transistors are depletion type transistors.

4. A NAND-type flash memory device according to claim 3 wherein the first string select transistor and the fourth string select transistor are enhancement type transistors and wherein the second and third string select transistors are depletion type transistors.

5. A method of driving a NAND-type flash memory device having a cell array region, the cell array region including: a first string containing a first string select transistor of an enhancement type sequentially connected in series between a bit line and a source line, a second string select transistor of a depletion type, a plurality of first cell transistors each having a floating gate and a control gate, a first source select transistor of an enhancement type, and a second source select transistor of a depletion type; a second string containing a third string select transistor of a depletion type sequentially connected in series between said bit line and said source line, a fourth string select transistor of an enhancement type, a plurality of second cell transistors each having a floating gate and a control gate, a third source select transistor of a depletion type, and a fourth source select transistor of an enhancement type; a first string select line connected to a gate electrode of said first string select transistor and a gate electrode of said third string select transistor; a second string select line connected to a gate electrode of said second string select transistor and a gate electrode of said fourth string select transistor; a plurality of wordlines connecting each control gate of said first cell transistors and each control gate of said second cell transistors; a first source select line connected to a gate electrode of said first source select transistor and a gate electrode of said third source select transistor; and a second source select line connected to a gate electrode of said second source select transistor and a gate electrode of said fourth source select transistor, wherein said first string, said second string, said first string select line, said second string select line, said plurality of wordlines, said first source select line, and said second source select line are repeatedly arranged in a matrix type, the NAND-type flash memory device driving method comprising: applying 0 volt and a program inhibition voltage to said selected bit line and said selected source line, respectively; applying a first voltage to said first string select line and said second source select line passing between said selected bit line and said selected source line and applying a second voltage different from said first voltage to said second string select line and said first source select line passing between said selected bit line and said selected source line, to thereby select a string; and applying a program voltage and a pass voltage to the selected wordline and unselected wordlines among the plurality of wordlines passing through said selected string, respectively, thereby selectively programming a cell transistor in the intersectional portion of said selected string and said selected wordline.

6. A NAND-type flash memory device driving method as claimed in claim 3, wherein said program inhibition voltage is between a power supply voltage and a voltage double said power supply voltage.

7. A NAND-type flash memory device driving method as claimed in claim 5, wherein said second string is selected when said first voltage is 0 volt and said second voltage is a voltage between a power supply voltage and a voltage double said power supply voltage, respectively.

8. A NAND-type flash memory device driving method as claimed in claim 5, wherein said first string is selected when said first voltage is between a power supply voltage and a voltage double said power supply voltage, and said second voltage is 0 volt.

9. A NAND-type flash memory device driving method as claimed in claim 5, wherein said program voltage is 12~20 volt.

10. A NAND-type flash memory device driving method as claimed in claim 9, wherein said pass voltage is lower than said program voltage and higher than a threshold voltage of the programmed cell.

11. A method of driving a NAND-type flash memory device having a cell array region, the cell array region including: a first string containing a first string select transistor of an enhancement type sequentially connected in series between a bit line and a source line, a second string select transistor of a depletion type, a plurality of first cell transistors each having a floating gate and a control gate, a first source select transistor of an enhancement type, and a second source select transistor of a depletion type; a second string containing a third string select transistor of a depletion type sequentially connected in series between said bit line and said source line, a fourth string select transistor of an enhancement type, a plurality of second cell transistors each having a floating gate and a control gate, a third source select transistor of a depletion type, and a fourth source select transistor of an enhancement type; a first string select line connected to a gate electrode of said first string select transistor and a gate electrode of said third string select transistor; a second string select line connected to a gate electrode of said second string select transistor and a gate electrode of said fourth string select transistor; a plurality of wordlines connecting each control gate of said first cell transistors and each control gate of said second cell transistors; a first source select line connected to a gate electrode of said first source select transistor and a gate electrode of said third source select transistor; and a second source select line connected to a gate electrode of said second source select transistor and a gate electrode of said fourth source select transistor, wherein said first string, said second string, said first string select line, said second string select line, said plurality of wordlines, said first source select line, and said second source select line are repeatedly arranged on a body in a matrix type, the NAND-type flash memory device driving method comprising: applying a bit line voltage for reading and 0 volt to said selected bit line and source line, respectively; applying a third voltage to said first string select line and first source select line between said selected bit line and source line, and applying a fourth voltage different from said third voltage to said second string select line and second source select line between said selected bit line and said selected source line, to select a string; and applying a read voltage and 0 volt to said selected wordline and unselected wordlines, respectively, thereby selectively reading out information stored in a cell transistor in the intersectional portion of said selected string and said selected wordline.

12. A NAND-type flash memory device driving method as claimed in claim 11, wherein said second string is selected when said third and fourth voltages are 0 volt and a read voltage, respectively.

13. A NAND-type flash memory device driving method as claimed in claim 11, wherein said first string is selected when said third and fourth voltages are a read voltage and 0 volt, respectively.

14. A NAND-type flash memory device driving method as claimed in claim 12, wherein said read voltage is between a power supply voltage and a voltage double said power supply voltage.

15. A NAND-type flash memory device driving method as claimed in claim 13, wherein said read voltage is between a power supply voltage and a voltage double said power supply voltage.

16. A method of selectively erasing a NAND-type flash memory device, the NAND-type flash memory device comprising:
an array of first and second memory cell strings in an integrated circuit body, each of which extends in parallel between a bit line and a source line;
the first memory cell strings each comprising a first string select transistor, a second string select transistor, a plurality of first floating gate memory cell transistors, a first source select transistor and a second source select transistor which are serially connected between the bit line and the source line;

the second memory cell strings each comprising a third string select transistor, a fourth string select transistor, a plurality of second floating gate memory cell transistors, a third source select transistor and a fourth source select transistor which are serially connected between the bit line and the source line;

a plurality of word lines, a respective one of which is connected to a respective one of the plurality of first and second floating gate memory cell transistors;

a first string select line which is connected to the first and third string select transistors;

a second string select line which is connected to the second and fourth string select transistors;

a first source select line which is connected to the first and third source select transistors; and a second source select line which is connected to the second and fourth source select transistors;

the method of selectively erasing a NAND-type flash memory device comprising the steps of:

applying a predetermined voltage to a selected word line;

floating the source line, unselected ones of the word lines, the first and second source select lines, the bit lines and the source line; and applying an erase voltage to the integrated circuit body.

17. A method according to claim 16 wherein the predetermined voltage is zero volts and wherein the erase voltage is between about 15 and about 20 volts.

18. A method of selectively reading a NAND-type flash memory device, the NAND-type flash memory device comprising:

an array of first and second memory cell strings in an integrated circuit body, each of which extends in parallel between a bit line and a source line;

the first memory cell strings each comprising a first string select transistor, a second string select transistor, a plurality of first floating gate memory cell transistors, a first source select transistor and a second source select transistor which are serially connected between the bit line and the source line;

the second memory cell strings each comprising a third string select transistor, a fourth string select transistor, a plurality of second floating gate memory cell transistors, a third source select transistor and a fourth source select transistor which are serially connected between the bit line and the source line;

a plurality of word lines, a respective one of which is connected to a respective one of the plurality of first and second floating gate memory cell transistors;

a first string select line which is connected to the first and third string select transistors;

a second string select line which is connected to the second and fourth string select transistors;

a first source select line which is connected to the first and third source select transistors; and a second source select line which is connected to the second and fourth source select transistors;

the method of selectively reading a NAND-type flash memory device comprising the steps of:

applying a first voltage to a selected bit line;

floating the unselected bit lines;

applying a second voltage to the source line;

applying a third voltage to the first string select line and to the first source select line between the selected bit line and the source line;

applying a fourth voltage which is different from the third voltage, to the second string select line and the second source select line between the selected bit line and the source line to thereby select a string;

applying a sixth voltage to a selected word line; and applying a seventh voltage to the unselected word lines, to thereby selectively read the floating gate memory cell transistor at the intersection of the selected string and the selected word line.

19. A method according to claim 18 wherein the second voltage and sixth voltage are zero volts, wherein the third voltage is one of a read voltage and zero volts, wherein the fourth voltage is the other of the read voltage and zero volts, and wherein the seventh voltage is the read voltage.

20. A method according to claim 18 wherein the read voltage is between a power supply voltage and twice the power supply voltage.

* * * * *